US 6,594,334 B1
United States Patent
Ota
(10) Patent No.: US 6,594,334 B1
(45) Date of Patent: Jul. 15, 2003

(54) EXPOSURE METHOD AND EXPOSURE APPARATUS (75) Inventor: Kazuya Ota, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/697,638

(22) Filed: Oct. 27, 2000

(51) Int. Cl.⁷ .............................. G21K 5/00
(52) U.S. Cl. ............................ 378/34; 378/119
(58) Field of Search .................. 378/34, 119, 84

(56) References Cited

U.S. PATENT DOCUMENTS

| 5,577,092 A | 11/1996 | Kublak et al. ........... 378/119 |
| 5,737,137 A | * 4/1998 | Cohen et al. ............. 378/34 |
| 6,208,707 B1 | 3/2001 | Oshino |

FOREIGN PATENT DOCUMENTS

| EP | 0 174 877 A2 | 3/1986 |
| JP | 5-217858 A | 8/1993 |
| JP | 5-217858 | 8/1993 |
| JP | 7-263322 A | 10/1995 |
| JP | 7-263322 | 10/1995 |
| JP | 11-126745 A | 5/1999 |
| JP | 11-251226 A | 9/1999 |
| JP | 2000-349009 A | 12/2000 |

* cited by examiner

*Primary Examiner*—Drew A. Dunn
(74) *Attorney, Agent, or Firm*—Oliff & Berridge, PLC (57) ABSTRACT

Laser light emitted from a high output laser light source is condensed by a condenser lens to form a condensed point. Xenon (Xe) gas or the like as a target is injected from a nozzle to the condensed point to generate Extreme Ultra Violate (EUV) light, and then the generated EUV light is condensed by a condenser mirror. A transmission filter having a predetermined transmittance with respect to the EUV light is disposed between the condenser mirror and a reflecting mirror, and scattering particles mixed in the EUV light are adsorbed by the transmission filter. The EUV light passing through the transmission filter is deviated by the reflecting mirror, a illuminance distribution of the EUV light is uniformalized by fly eye mirrors, thereafter the EUV light is condensed by another condenser mirror, and then exposure is effected using the condensed EUV light as an exposure beam.

20 Claims, 5 Drawing Sheets

EXPOSURE METHOD AND EXPOSURE APPARATUS

BACKGROUND OF THE INVENTION

1. Field of the Invention

The present invention relates to an exposure method and an exposure apparatus used when a mask pattern is transferred onto a substrate in a lithography process for producing semiconductor integrated devices, image pickup devices (CCDs etc.), plasma displays, liquid crystal display devices and the like. More particularly, the present invention is preferably used when Extreme Ultra Violet light (EUV light) such as soft X-ray is used as an exposure beam.

2. Description of the Related Art

When semiconductor devices or the like are produced, in order to transfer a pattern of a reticle as a mask onto a wafer (or a glass plate or the like) as a substrate on which a resist is applied, various exposure apparatuses such as a projection exposure apparatus such as a stepper, and a proximity-type exposure apparatus for directly transferring the pattern onto the wafer are used. Such an exposure apparatus conventionally used ultra violet light such as an i-ray (wavelength of 365 nm) of a mercury lamp and KrF excimer laser light (wavelength of 248 nm) as illumination light for exposure (exposure beam). Recently, in order to obtain higher resolution, development work has been proceeding to develop an exposure apparatus using vacuum ultraviolet light (VUV light) such as ArF excimer laser light (wavelength of 193 nm) and $F_2$ laser light (wavelength of 157 nm) as an exposure beam. As an illumination system or projection optical system of such a conventional exposure apparatus, a refractive system or a reflection refractive system has been used.

Further, in order to produce finer semiconductor devices and the like, development work has also been proceeding to develop an EUV exposure apparatus which uses, as an exposure beam, extreme ultra violet light (EUV light) such as a soft X-ray having a wavelength of about 100 nm or smaller. This EUV exposure apparatus uses, as an exposure light source, a SOR (Synchrotron Orbital Radiation) ring or a laser plasma light source or the like. The latter laser plasma light source utilizes EUV light, ultraviolet light, visible light and other light having other wavelengths which are generated when an EUV light generating material (target) excited into a high temperature plasma state by irradiating the target with high brightness laser light is cooled. For exposure, EUV light having a wavelength of 5 to 20 nm is mainly used as the exposure beam. In the EUV exposure apparatus which is under development at present, since an optical member which allows EUV light to pass therethrough excellently has not yet been developed, both the illumination optical system and the projection optical system are constituted by reflection type optical members, and a reticle is also of reflection type.

Further, it is preferable to keep most portion of an optical path of an exposure beam of EUV light in a substantially vacuum state, but in order to maintain the entire optical path of the exposure beam in a high vacuum, a structure of the exposure apparatus is increased in size as a whole, and producing cost thereof is also increased. Thereupon, Japanese patent Application Laid-open No. 5-217858, for example, proposes an exposure apparatus in which an optical path of an exposure beam is divided into a plurality of partial optical paths to vary a degree of vacuum among the partial optical paths, or gas having relatively high transmittance such as helium gas (He) is supplied to a portion of the optical path at which a degree of vacuum may be low. In this exposure apparatus, a window member which is transparent with respect to the exposure beam is disposed at a boundary portion for separating adjacent partial optical paths from each other.

Further, Japanese Patent Application Laid-open No. 7-263322 also proposes an exposure apparatus in which an optical path of exposure beam is divided into a plurality of partial optical paths to vary a degree of vacuum among the partial optical paths, and a window member which is transparent with respect to the exposure beam is disposed at a boundary between adjacent partial optical paths.

As described above, it has also been studied to use the laser plasma light source as the exposure light source in the EUV exposure apparatus. However, the EUV exposure apparatus using the laser plasma light source has a problem that when a target is irradiated with laser light, portions of the target itself fly away as scattering particles, i.e., debris, and the debris reach an illumination optical system, a reticle, a projection optical system and the like on the optical path of an exposure beam, and attach on a reflection member and the like used in them, and a reflectance is largely lowered.

For this reason, as disclosed in the U.S. Pat. (USP) No. 5,577,092, development work has been proceeding to develop a laser plasma light source using a gas jet cluster as a target for the purpose of not generating debris. However, also in this case, a nozzle for injecting gas is eroded by high temperature plasma generated in the vicinity of the nozzle, and some debris are adversely generated from the nozzle.

In the case of an exposure apparatus in which an optical path of an exposure beam of EUV light is divided into a plurality of partial optical paths to vary a degree of vacuum among the partial optical paths (or to supply gas having high transmittance), a window member which is transparent with respect to the exposure beam is disposed at a boundary portion between adjacent partial optical paths so as to maintain hermeticity therebetween. However, the window member in such a structure is made of material having a transmittance with respect to the exposure beam as high as possible, and is formed thin so that the transmittance as a whole with respect to the exposure beam is improved to be as high as possible. Therefore, an effect for preventing debris from reaching an optical system located at a rear stage is not so great. Further, there is an adverse possibility that the window member is largely damaged by high temperature plasma and the like when the exposure light source is a laser plasma light source.

SUMMARY OF THE INVENTION

In view of the above circumstances, it is an object of the present invention to provide an exposure method capable of suppressing deterioration of optical characteristics of an optical member which guides an exposure beam onto a pattern to be transferred or a substrate to be exposed even though the exposure method uses a light source in which particles such as scattering particles (debris) and the like are prone to be mixed in the emitted exposure beam.

Further, it is another object of the present invention to provide an exposure apparatus capable of carrying out such an exposure method.

According to a first aspect of the present invention, there is provided an exposure method, comprising a step of transferring, using light having a wavelength of 100 nm or smaller as an exposure beam, a predetermined pattern onto a substrate, wherein when the pattern is irradiated with the exposure beam through a plurality of reflection members, particles mixed in the exposure beam is reduced.

According to the exposure method of the first aspect of the present invention, like when a laser plasma light source is used, for example, even if scattering particles are mixed in the exposure beam, the scattering particles are reduced on an optical path of the exposure beam. Therefore, the amount of scattering particles attaching to the reflection members is reduced and thus, the deterioration in optical characteristics such as reduction in reflectance of the reflection members or the pattern is suppressed.

According to a second aspect of the invention, there is provided an exposure apparatus which transfers, using light having a wavelength of 100 nm or smaller as an exposure beam, a predetermined pattern onto a substrate, comprising:

a light source which generates the light having the wavelength of 100 nm or smaller as the exposure beam;

a plurality of reflection members which guides the exposure beam emitted from the light source to the pattern; and a transmission member disposed on an optical path of the exposure beam between the light source and the pattern and having a predetermined transmittance.

According to the exposure apparatus of second aspect of the present invention, a function of particle adsorption by the transmission member is aggressively utilized, and the particles in the exposure beam is adsorbed or absorbed by the transmission member. That is, even if the scattering particles are generated from the light source, the scattering particles are absorbed by the transmission member on the optical path of the exposure beam. Therefore, it is possible to prevent the scattering particles from diffusing toward the pattern beyond the transmission member, and it is possible to suppress the reduction in reflectance of the reflection member or the pattern caused by the scattering particles, and the exposure method of the first aspect of the present invention can be carried out.

In this case, it is preferable to dispose a reflection type optical integrator between the light source and the pattern, and to dispose the transmission member between the light source and the optical integrator. With this arrangement, even if the transmittance of the transmission member becomes uneven and the illumination of the exposure beam becomes uneven in some degree due to variation in thickness of the transmission member or due to the attachment of the scattering particles to the transmission members, the illumination distribution of the exposure beam is uniformalized by the reflection type optical integrator.

One example of the transmission member is a thin film (membrane) made of silicon (Si). A cooling mechanism for the transmission member may be provided, or a mechanism for replacing the transmission member when the transmittance of the transmission member becomes uneven may be provided. Since the transmission member of the present invention is not disposed at the boundary between spaces having different degrees of vacuum, it is easy to provide the cooling mechanism or the replacing mechanism.

According to a third aspect of the present invention, there is provided an exposure apparatus which transfers a pattern formed on a mask onto an object, comprising:

a light source which generates extreme ultra violet light;

an illumination optical system disposed, to illuminate the mask with the extreme ultra violet light, on an optical path through which the extreme ultra violet light passes, the illumination optical system including a plurality of reflection optical elements which includes an optical integrator; and an optical element disposed between the light source and the optical integrator to reduce substances which are generated at the light source, flow into the optical path and lower reflectivity of the reflection optical elements.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

One example an embodiment of the present invention will be explained with reference to the drawings below.

Figure 1:
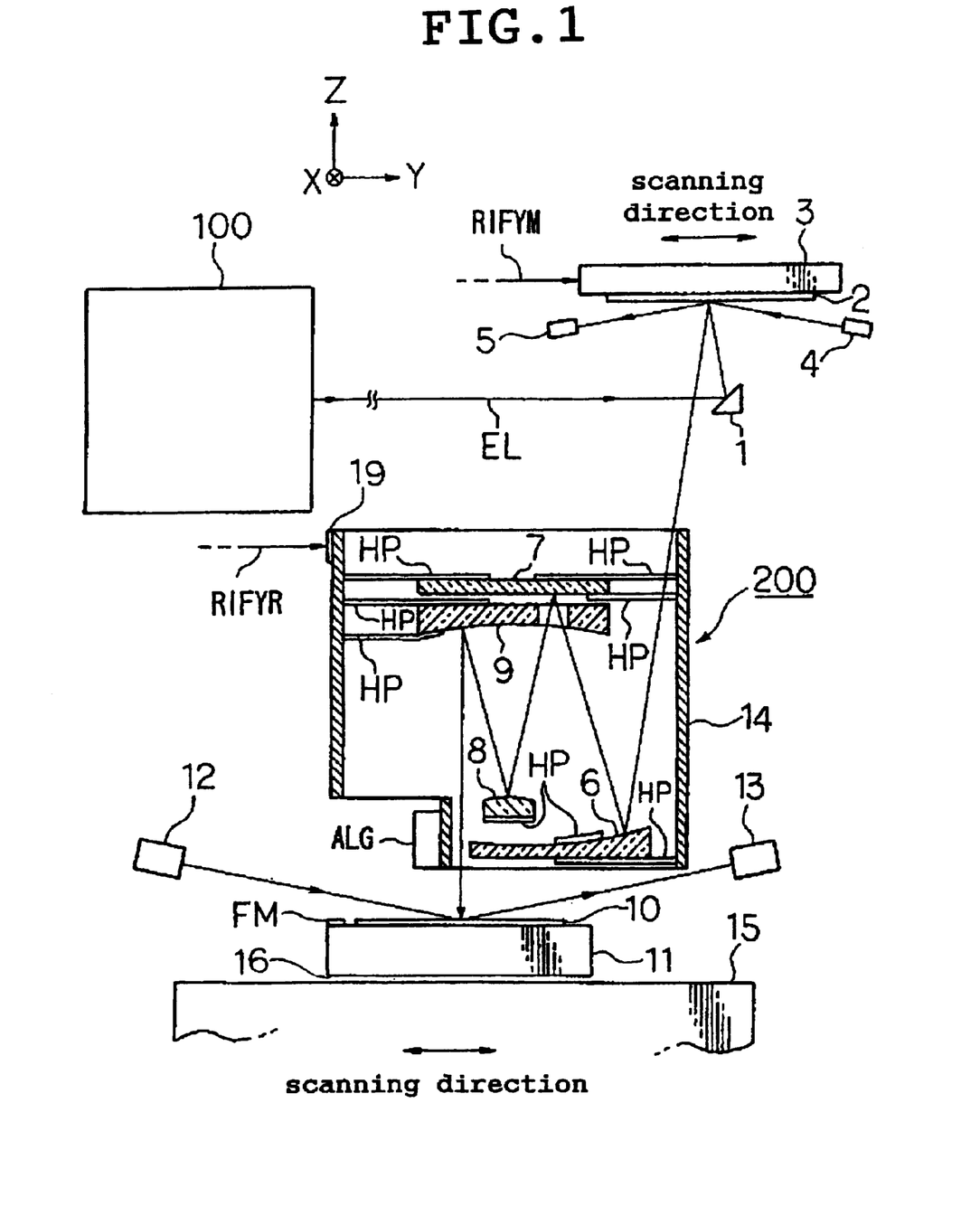
FIG. 1 is a schematic partial sectional view showing one example of one embodiment of the present invention.

FIG. 1 schematically shows an entire structure of an exposure apparatus of the present example. In FIG. 1, the exposure apparatus of the present example is a reduction projection type exposure apparatus for carrying out a scanning exposure operation in a step-and-scan manner using, as an exposure beam (exposure light), Extreme Ultraviolet Light ("EUV light", hereinafter) EL in a soft X-ray region having a wavelength of 5 to 20 nm. As will be described later, the present example uses a projection optical system 200 which projects a main beam of a reflection luminous flux from a reticle 2 as a mask disposed on an object side substantially perpendicularly onto a wafer 10 disposed on an image side. The projection optical system 200 is a reflection system (projection magnification is ¼, ⅕, ⅙ and the like) including only a plurality of (e.g., three to eight, and four in FIG. 1) reflection optical devices, and the reflection system is non-telecentric on the object side and is telecentric on the image side. In the following explanation, a direction parallel to the main beam of the EUV light EL entering the wafer 10 from the projection optical system 200 is called as an optical axis direction of the projection optical system 200. It is defined that a Z-axis is parallel to the optical axis direction, a Y-axis is directed to a lateral direction of the paper sheet of FIG. 1 within a plane perpendicular to the Z-axis (corresponding to a substantially "horizontal plane" in the present example), and an X-axis is perpendicular to the paper sheet of FIG. 1.

The exposure apparatus of the present example comprises an illumination system 100 including a laser plasma light source as an exposure light source. The EUV light EL as an exposure beam is emitted to an exposure body substantially horizontally along the Y direction. The exposure body comprises a reflecting mirror 1 for reflecting the EUV light EL from the illumination system 100 to allow the EUV light EL to enter a pattern surface (a lower surface in FIG. 1) of the reticle 2 at a predetermined incident angle, a reticle stage 3 as a mask stage for holding the reticle 2, the projection optical system 200 including a refection system for projecting the EUV light EL reflected from the pattern surface of the reticle 2 onto a surface to be exposed of the wafer 10, oblique-incidence type autofocus sensors ("AF sensors" hereinafter) 4 and 5 located on the reticle side, oblique-incidence type AF sensors 12 and 13 on the wafer side, an off-axis type alignment sensor ALG as a mark detecting system, and the like.

First, the illumination system 100 of the present example will be explained with reference to FIGS. 2 to 5.

Figure 2:
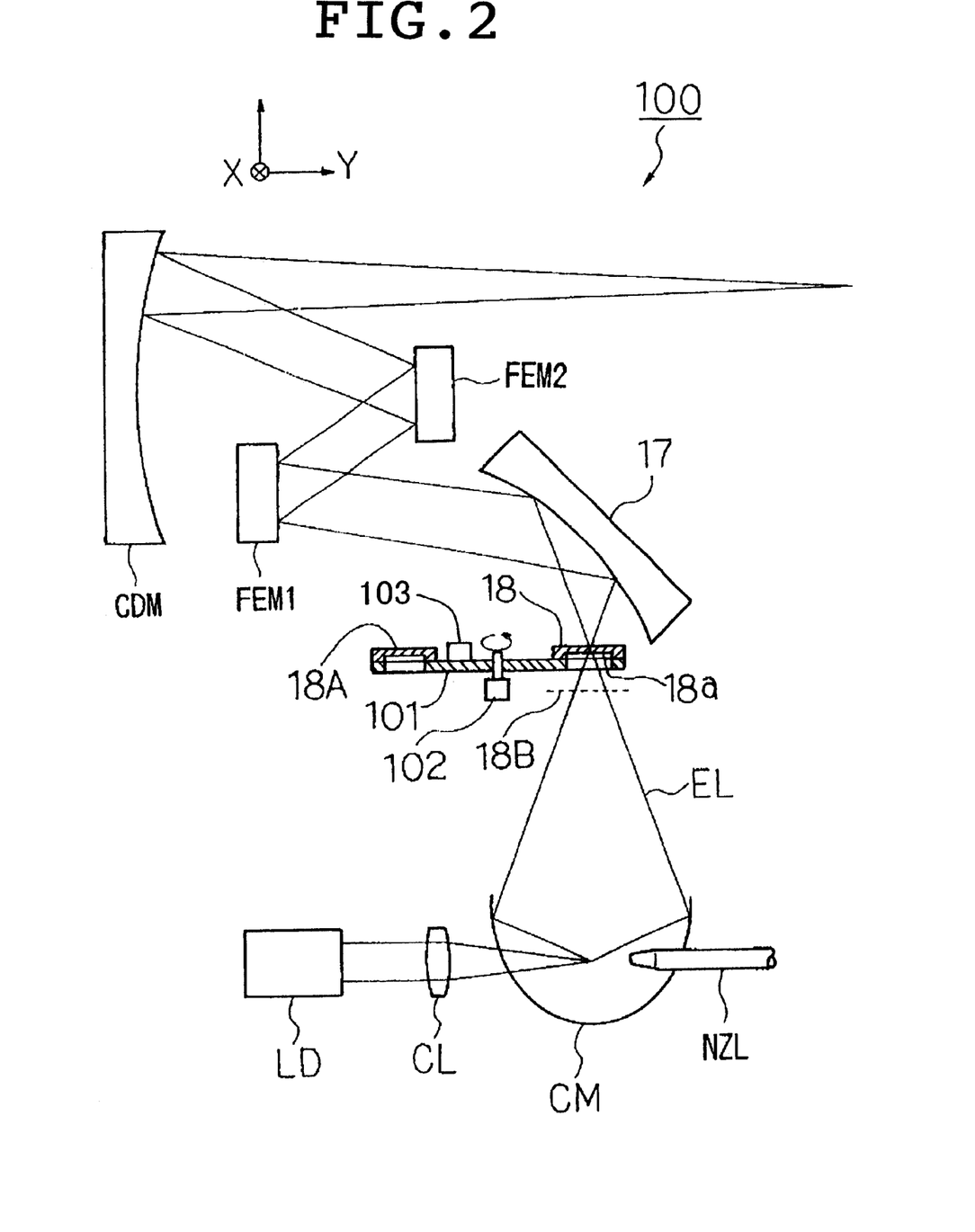
FIG. 2 is diagram, partly in section, showing an illumination system 100 shown in FIG. 1.

FIG. 2 shows the illumination system 100. In FIG. 2, the gas jet cluster type laser plasma light source of the present example includes a high output laser light source LD such as a YAG laser light source utilizing semiconductor laser pumping or an excimer laser light source, a condenser lens CL for condensing laser light from the high output laser light source LD, a nozzle NZL for injecting xenon gas (Xe), krypton gas (Kr) and the like as a target of the laser plasma light source, and a condenser mirror CM.

Here, the manner of generating EUV light will be explained simply. First, laser light emitted from the high output laser light source LD is condensed to one point by the condenser lens CL. Xenon gas, krypton gas and the like as the target of the laser plasma light source are injected from the nozzle NZL to this condensed point, and the target is optically pumped into a plasma state by energy of the laser light from the high output laser light source LD. When the target is changed to a low potential state (cooled), the target emits EUV light, ultraviolet light having a wavelength of 100 nm or longer, visible light and other light having other wavelengths.

The EUV light and the like generated in this manner diverge to all directions. For the purpose of condensing or gathering the light, there is provided the condenser mirror CM having a spheroidal reflection plane which is formed such as to surround the target. The laser light from the high output laser light source LD is condensed in the vicinity of a first focus in the condenser mirror CM. An inner surface of the condenser mirror CM is formed with an EUV light reflection layer for reflecting the EUV light, and a cooling apparatus (not shown) is mounted to a back face of the condenser mirror CM. Since light having a wavelength which is not reflected is absorbed by a multilayered film and the like and changed into heat, the condenser mirror CM rises in temperature. A cooling apparatus for cooling the condenser mirror CM is necessary. As the cooling apparatus, one using a cooling liquid is preferable in terms of cooling efficiency, but the cooling apparatus is not limited to this. A metal is suitable as a material of the condenser mirror CM because the metal has excellent thermal conductivity. It is known that when a multilayered film including two kinds of materials laminated alternately is used as a reflection layer of EUV light formed on a surface of the condenser mirror CM, it is possible to reflect only light having a specific wavelength. For example, when molybdenum (Mo) and silicon (Si) are alternately coated several tens layers, it is possible to selectively reflect EUV light having a wavelength of about 13 nm. Further, when molybdenum (Mo) and beryllium (Be) are alternately coated several tens layers, it is possible to selectively reflect EUV light having a wavelength of about 11 nm.

The EUV light EL selectively reflected by the condenser mirror CM of the present example is condensed in the vicinity of a second focus of the condenser mirror CM as an exposure beam. A transmission filter 18 (the detail of which will be described later) having a predetermined transmittance with respect to the EUV light EL is disposed in the vicinity of the second focus. The EUV light EL reflected and condensed by the condenser mirror CM passes through the transmission filter 18 and then, the EUV light EL is reflected and deflected by a concave reflection surface of reflecting mirror 17 and becomes a substantially parallel luminous flux, and enters the first fly eye mirror FEM1 as a reflection type optical integrator (homogenizer). The EUV light EL reflected by the first fly eye mirror FEM1 is reflected by the second fly eye mirror FEM2 and its illumination distribution is uniformed. In this state, the EUV light EL is reflected and condensed by a condenser mirror CDM, and deviated toward the reflecting mirror 1 shown in FIG. 1.

Although it is not illustrated in FIG. 2, an EUV light selection plate is provided on the traveling direction side (right side in FIG. 2) of the EUV light EL reflected by the condenser mirror CDM for the purpose of filtering out ultraviolet light other than light having exposure wavelength and visible light and allowing only EUV light EL to pass. This is because the EUV reflection film including the multilayered film formed on the condenser mirror CM has considerably sharp wavelength selectivity with respect to a wavelength of near the EUV light, and selectively reflects only light of a specific wavelength used for exposure, but the EUV reflection film also adversely reflect ultraviolet light having a wavelength far from the exposure wavelength, visual light and the like as well. When such light having these wavelengths is introduced to the reticle 2 and the projection optical system 200, because of excessive energy, there is an adverse possibility that the mirrors 6 to 9 constituting the reticle 2 and the projection optical system 200 may be heated, and at the worst, unnecessary light may be transferred onto the wafer 10 and an image may be deteriorated. Therefore, the unnecessary light is eliminated by the EUV light selection plate. A thin metal film or the like can be used as the EUV light selection plate. The transmission filter 18 may be provided with a function of the EUV light selection plate.

The above-described laser plasma light source, the transmission filter 18, the reflecting mirror 17, the first fly eye mirrors FEM1 and FEM2, the condenser mirror CDM and the like constitute the illumination system 100. The transmission filter 18 of the present example is disposed at the incident surface side of the reflecting mirror 17, i.e., between the first fly eye mirrors FEM1 and FEM2 and the plasma light source, and therefore, the first fly eye mirrors FEM1 and FEM2 will be explained first.

Figure 4A:
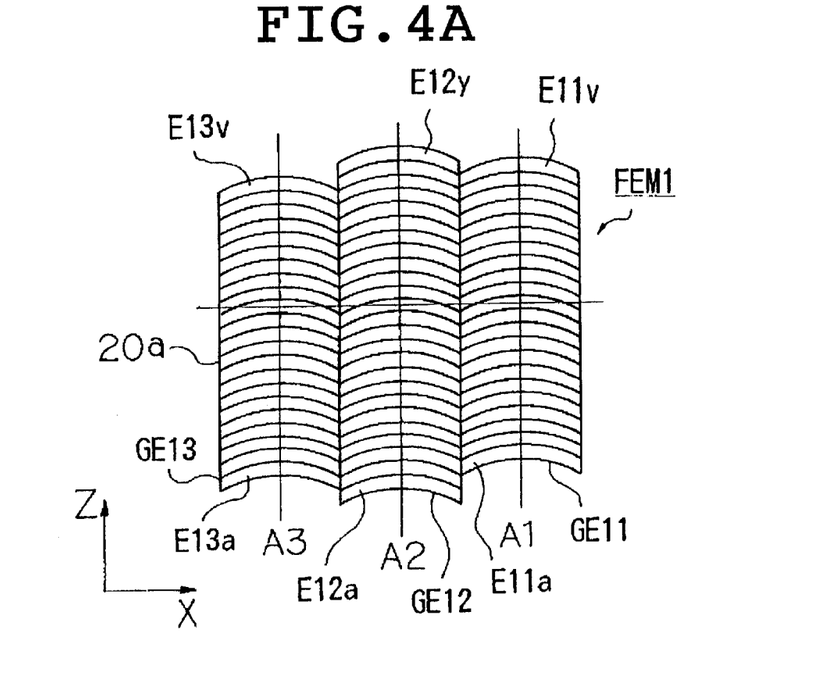
FIG. 4A is a diagram showing a first fly eye mirror FEM1.
Figure 4B:
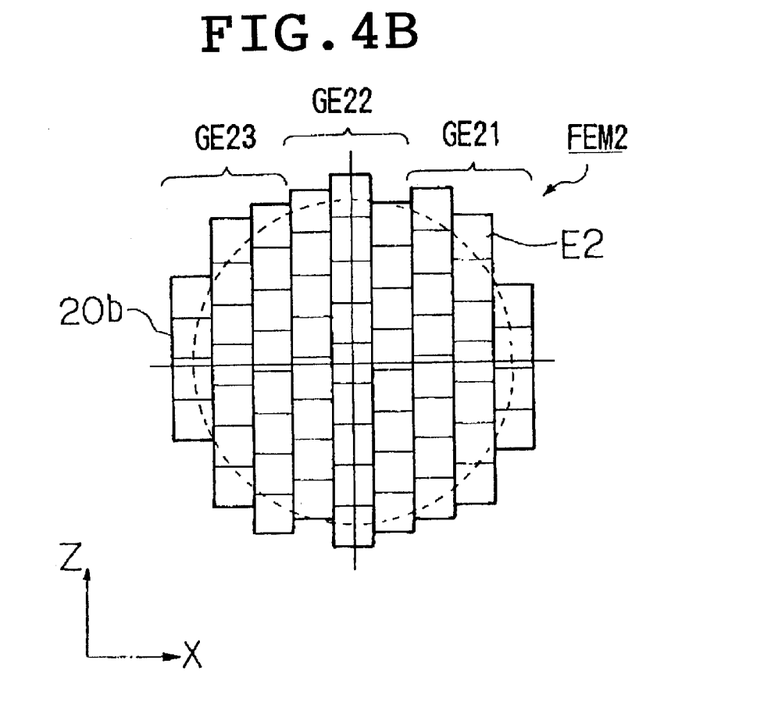
FIG. 4B is a diagram showing a second fly eye mirror FEM2.

As shown in FIG. 4A, the first fly eye mirror FEM1 includes a plurality of (three, in the present example) optical device groups GE11 to GE13. The optical device groups GE11, GE12 and GE13 respectively include reflection optical devices E11a to E11v, E12a to E12y and E13a to E13v respectively arranged along axes A1, A2 and A3 parallel to the Z axis and respectively having arc reflection surfaces which are elongated in the X direction. As shown in FIG. 4B, the second fly eye mirror FEM2 includes a plurality of (three, in the present example) optical device groups GE21 to GE23. The optical device groups GE21 to GE23 include a plurality of reflection optical devices E2 each having a substantially square reflection surface. The optical device groups GE21 to GE23 are arranged circular as a whole.

Figure 5:
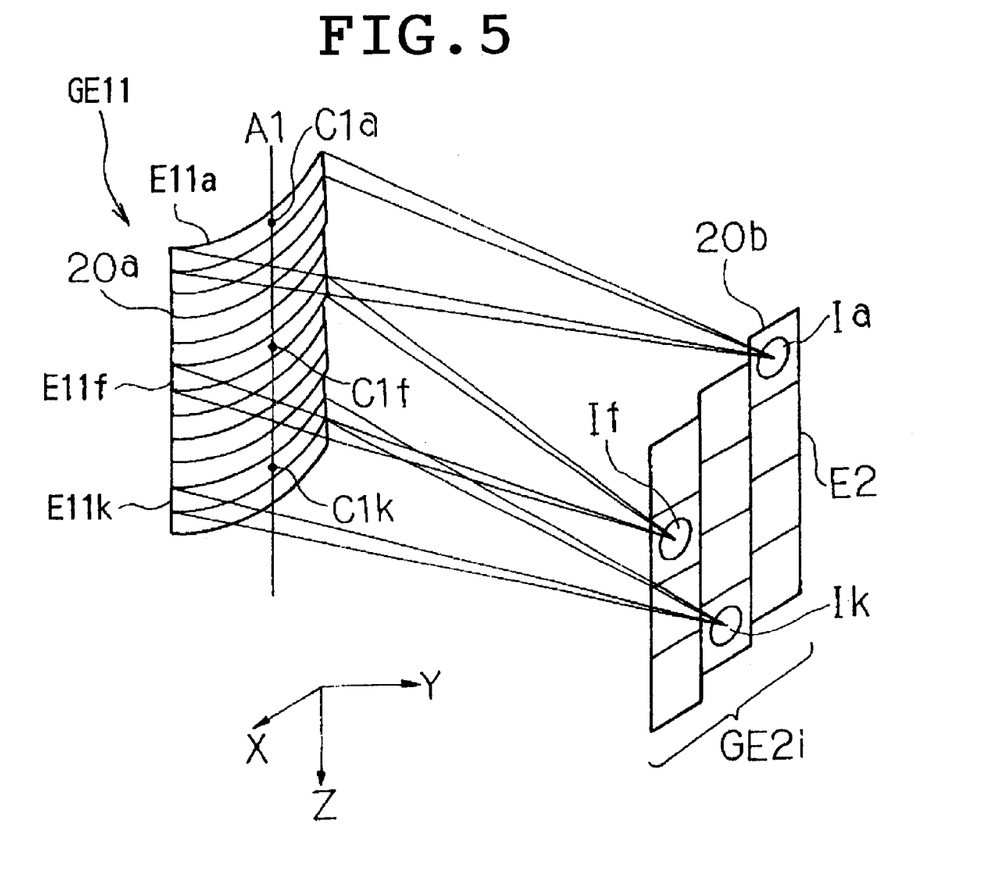
FIG. 5 is a partially enlarged perspective view showing the first fly eye mirror FEM1 of FIG. 4A and the second fly eye mirror FEM2 of FIG. 4B.

As shown in FIG. 5, of luminous fluxes (exposure beams) entering the optical device group GE11 having the axis A1 of the first fly eye mirror FEM1, a luminous flux reflected by the reflection optical device E11a having an upper point C1a as its center enters reflection surfaces (expressed with a region Ia as a representative) of a plurality of upper reflection optical devices E2 of the optical device group GE2i (i=1 to 3) of the second fly eye mirror FEM2. Similarly, of luminous fluxes entering the optical device group GE11, a luminous flux reflected by the reflection optical devices E11$f$ and E11$k$ respectively having a center point C1$f$ and a lower point C1$k$ as their centers enter reflection surfaces (expressed with regions If and Ik as representatives) of a plurality of center and lower members of the reflection optical devices E2 of the optical device group GE2$i$. In this manner, each luminous flux from each of the reflection optical devices of the optical device groups GE11 to GE13 of the first fly eye mirror FEM1 enters the plurality of laterally arranged reflection optical devices E2 of the second fly eye mirror FEM2.

In this case, the number of the reflection optical devices of the first fly eye mirror FEM1 arranged in the Z direction is about three times more than the number of those of the second fly eye mirror FEM2 arranged in the Z direction. Therefore, illuminance on each of the reflection optical devices E2 of the second fly eye mirror FEM2 is uniformed by integral effect. The condenser mirror CDM shown in FIG. 2 is irradiated, in a superimposing manner, with reflection light from each of the reflection optical device E2 of the second fly eye mirror FEM2, thereby further enhancing the uniformity of the illuminance distribution of the EUV light EL.

When the laser plasma light source is used as in the present example, the nozzle NZL shown in FIG. 2 may be eroded by high temperature plasma and thus scattering particles, i.e., debris may be adversely generated from the nozzle NZL in some cases. In order to avoid ill effects such as deterioration in illuminance and deterioration in uniformity of illuminance distribution of the exposure beam which are caused by debris attaching to the optical members (such as the reflecting mirrors 1 and 17, the fly eye mirrors FEM1 and FEM2, the condenser mirror CDM, the reticle 2, the projection optical system 200) used in the exposure apparatus, and the like, the transmission filter 18 is disposed at the incident surface side of the reflecting mirror 17 in the illumination system 100 of the present example. The transmission filter 18 of the present example is formed in such a manner that a central portion of a silicon wafer which is a disk-like silicon (Si) is etched into a predetermined thickness to form a thin film portion 18$a$ (membrane). When EUV light EL as the exposure beam passes through the thin film portion 18$a$ corresponding to the transmission member, most of debris mixed in the EUV light EL is adsorbed or absorbed. For this reason, it is preferable that the transmittance of the thin film portion 18$a$ is set in a range of 10 to 90% with respect to the EUV light EL.

In FIG. 2, the transmission filter 18 for EUV light of the present example is mounted on a rotation plate 101. The rotation plate 101 is also provided with an unused replacement transmission filter 18A. Further, the rotation plate 101 is also provided with a cooling apparatus 103, which effectively dissipates heat accumulated in the transmission filter 18. The cooling apparatus 103 may be of a liquid-cooling type in which cooled liquid is circulated, of a heat-absorbing type in which heat is absorbed using Peltier device or the like, of a heat exchange type in which heat is released to a heat-dissipating plate using a heat pipe, or the like. When the transmission filter 18 is damaged by irradiation of EUV light EL or when debris is attached and the transmittance of the thin film portion 18$a$ with respect to EUV light is lowered, a driving section 102 rotates the rotation plate 101 to replace the transmission filter 18 with the unused transmission filter 18A. By replacing the transmission filter 18 with the new one, the illuminance of the exposure beam is maintained at a high level.

The transmission filter 18 of the present example is disposed in the vicinity of the second focus of the condenser mirror CM on the optical path between the condenser mirror CM and the reflecting mirror 17, i.e., disposed at a position where a beam diameter of the EUV light EL becomes thinnest. A thickness of the thin film portion 18$a$ of the transmission filter 18 is set to 1 $\mu$m or smaller in some cases, and since the area of the thin film portion 18$a$ of the transmission filter 18 can be made minimum by the above-described disposition, there is a merit that the strength of the thin film portion 18$a$ can be maintained at a high level.

The transmission filter 18 may be disposed at a position slightly away from a position where the beam diameter of the EUV light EL becomes thinnest like a position 18B shown with a dotted line. At the position where the beam diameter of the EUV light EL becomes thinnest, energy of EUV light concentrates on substantially one point and thus, there is an adverse possibility that the transmission filter 18 is prone to be damaged. Therefore, when the transmission filter 18 is disposed at the position 18B slightly away from the position where the beam diameter of the EUV light EL becomes thinnest, it is possible to reduce a load of thermal stress applied to the transmission filter 18 to enhance the durability of the transmission filter 18 without increasing the area of the thin film portion 18$a$ of the transmission filter 18 so much.

Figure 3:
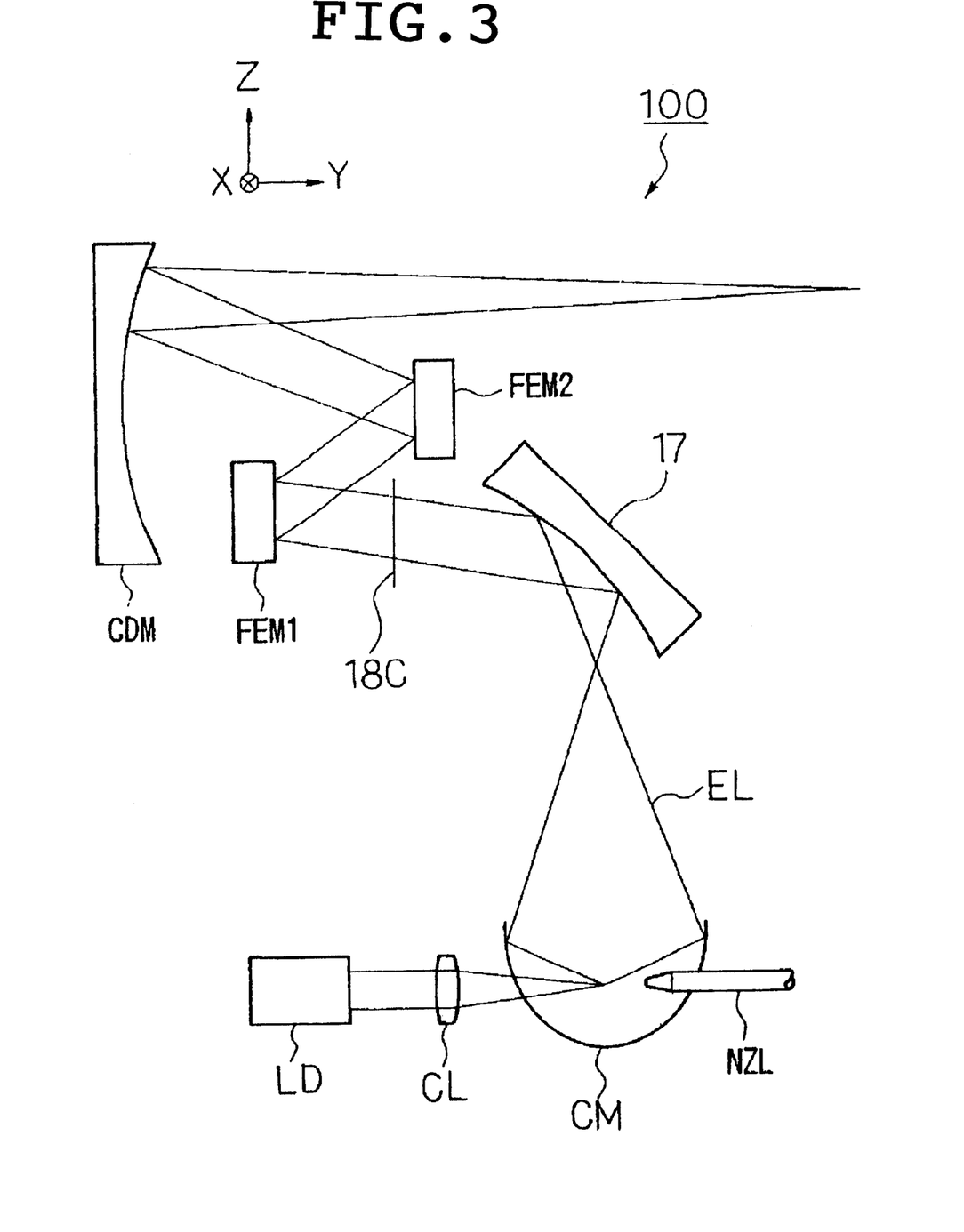
FIG. 3 is a diagram showing another example of the illumination system 100 shown in FIG. 2.

As shown in FIG. 3, the transmission filter 18 for EUV light may be disposed between the reflecting mirror 17 and the first fly eye mirror FEM1, i.e., at a position 18C immediately in front of the first fly eye mirror FEM1. It is necessary to increase the area of the thin film portion 18$a$ (see FIG. 2) of the transmission filter 18 as compared with a case in which the transmission filter 18 is disposed between the condenser mirror CM and the reflecting mirror 17, but it is possible to reduce the energy of the EUV light EL irradiated per unit area to enhance the durability of the transmission filter 18. Further, when the transmission filter 18 is disposed closer to the laser plasma light source than the first fly eye mirrors FEM1 and FEM2 as in the above-mentioned embodiment, even though the transmittance distribution of the transmission filter 18 becomes nonuniform and the illuminance distribution of the EUV light EL becomes nonuniform due to thickness variation of the thin film portion 18$a$ of the transmission filter 18 or attachment of debris to the transmission filter 18 and the like, there is a merit that the illuminance distribution of the EUV light EL is uniformed by the first fly eye mirrors FEM1 and FEM2.

Although silicon (Si) is used as the material for the transmission filter 18, the material of the transmission filter 18 is not limited to this, and any material may be used only if it has a predetermined transmittance with respect to the EUV light and it can prevent debris from entering the optical path of the EUV light.

Referring back to FIG. 1, although the reticle stage 3 for holding the reticle 2 is omitted in FIG. 1, actually, the reticle stage 3 is supported in a floating manner by a two-dimensional linear actuator of a magnetic levitation type on a reticle base disposed along an XY plane. The actuator includes a permanent magnet (not shown) provided on a bottom of a peripheral portion of the reticle stage 3, and a coil running throughout on the reticle base two dimensionally of the X and Y directions. By controlling a current flowing through the coil, six-dimensional position and attitude of the reticle stage 3 are controlled. That is, the reticle stage 3 is driven in the Y direction by the actuator through a predetermined stroke (e.g., about 100 mm or more), and is driven in the X direction and θ direction (direction of rotation around the Z axis) slightly. It is also possible to slightly drive the reticle stage 3 in an inclined direction with respect to the Z direction and the XY plane by the actuator.

The reticle stage 3 comprises a reticle holder for adsorbing and holding the reticle 2 such as to be opposed to the reticle base, a stage body for holding a periphery of the reticle holder, and a temperature control section, provided at a back face side (upper surface side) of the reticle holder within the stage body, for controlling a temperature of the reticle holder. The reticle holder holds the reticle 2 in an electrostatic chuck manner. This is because EUV light EL is used as the exposure beam and thus, actually, the exposure apparatus of the present example is accommodated in a vacuum chamber (not shown), and it is difficult to use a vacuum chuck type reticle holder. The reticle holder may be made of material such as low-expansion glass, ceramics or the like used in a conventional exposure apparatus using deep ultraviolet light (DUV light) having a wavelength of about 200 to 300 nm.

A plurality of temperature sensors are disposed on a reticle adsorbing surface of the reticle holder at predetermined distances from one another. The temperature sensors precisely measure a temperature of the reticle 2 and keep the temperature of the reticle 2 at a target temperature based on the measured value. A cooling apparatus constituting the temperature control section may be of a liquid-cooling type for introducing, therein, a cool liquid from outside through a flexible tube, of a type using an electronic device such as a Peltier device, or of a heat exchange type using a heat pipe.

A side surface of the reticle stage 3 at the −Y direction side is mirror finished and formed with a reflection surface for reflecting light in a visible region. Although it is not illustrated in FIG. 1, a side surface of the reticle stage 3 at the −X direction side is also mirror finished and formed with a reflection surface for reflecting light in the visible region. In the exposure apparatus of the present example, like the conventional exposure apparatus using DUV light as the exposure beam, a position and a rotation amount (yawing amount, pitching amount and rolling amount) of the reticle stage 3 in the XY plane are monitored by an interferometer system which irradiates the reflection surface and the like with a measurement beam. In this case, Y coordinate and the rotation amount (pitching amount) of the reticle stage 3 around the X axis with respect to the position of the projection optical system 200 is measured by a measurement beam RIFYR supplied to a reference mirror 19 provided on a side surface of the projection optical system 200 and a measurement beam RIFYM supplied to the reflection surface of the reticle stage 3. Similarly, X coordinate the rotation angle (rotation amount (yawing amount) around the Z axis and the rotation amount (rolling amount) around the Y axis of the reticle stage 3 with respect to the position of the projection optical system 200 are measured. The position (focus position) in the Z direction and the inclination amount of the reticle 2 are measured by the AF sensors 4 and 5 including an illumination optical system 4 for diagonally projecting a slit image on a surface to be detected and a photoreceiver optical system 5 for re-forming the image of the slit image with luminous flux from the surface to be detected and outputting a signal which corresponds to a lateral deviation amount of the re-image-formed image.

A reflection film for reflecting the EUV light EL is formed on a surface (pattern surface) of the reticle 2. This reflection film is, for example, a multilayered film including two kinds of material laminated alternately. When the wavelength of the EUV light EL is about 13 nm, when a multilayered film including alternately laminated molybdenum (Mo) and silicon (Si) is used, a reflectance of about 70% can be obtained. When the wavelength of the EUV light EL is about 11 nm, a multilayered film including alternately laminated molybdenum (Mo) and beryllium (Be) can be used as the reflection film. A master pattern is formed by applying an absorbing film which absorbs EUV light all over the reflection film and by patterning the absorbing film. If the reflection film itself such as the multilayered film is patterned, when a defect is caused in the pattern, it is difficult to repair the pattern, but if the absorbing film on the reflection film is patterned, the pattern can be reprocessed and thus, it is easy to repair the pattern. Since most of existent materials do not reflect EUV light, the materials can be used for the absorbing layer. In the present example, since the AF sensors 4 and 5 are used for measuring the position of the reticle 2 in the Z direction, the absorbing layer is made of material capable of obtaining a reflectance substantially equal to that of the reflection layer (reflection film). Other criteria for selecting material of the absorbing layer are that it is easy to form a pattern, the absorbing layer can be in tight contact with the reflection layer, and secular change by oxidation is small.

Since the reticle 2 is formed on its surface with the reflection layer as described above, its material itself is not especially limited. Examples of the material of the reticle 2 are low-expansion glass, quartz glass, ceramics, and a silicon wafer. As a criteria for selecting the material, the same material as the reticle holder may be used as the material of the reticle 2 for example. Thermal expansion is caused in the reticle 2 and the reticle holder due to temperature increasing by the irradiation of exposure beam and the like. If materials of both the members are the same, they expand in the same amount and thus, there is a merit that a deviation force (thermal stress) does not act between both the members. The material of the reticle 2 is not limited to this, and even if the material of the reticle 2 is different from that of the reticle holder, when the two materials have substantially the same thermal coefficients of linear expansion, the same effect can be obtained. For example, a silicon wafer may be used as the material of the reticle 2, and silicon carbide (SiC) may be used as the material of the reticle holder. When the silicon wafer is used as the material of the reticle 2, there is a merit that a processing apparatus and the like used for producing semiconductor devices such as a pattern forming apparatus, a resist applying apparatus and an etching apparatus can be used as they are for producing the reticle 2. In the present example, silicon wafer is used as the material of the reticle 2 and the reticle holder is made of SiC for these reasons.

Although it is not illustrated in FIG. 1, a movable blind and a slit plate as a field stop are disposed in proximity to and below the reticle 2 (on the incident side of the EUV light EL). More specifically, these movable blind and slit plate are disposed in the reticle base (not shown) on which the reticle stage 3 is disposed.

The slit plate is for defining an arc illumination region. The slit plate may be secured to the projection optical system 200, but in the present example, the slit plate can be driven by a driving mechanism as a switching mechanism including a motor and the like. The slip plate comprises a first slit for defining an arc illumination region on the reticle 2 irradiated with the EUV light EL as the exposure beam, and a second slit for defining an illumination region including portions of alignment marks formed on both sides of a pattern region of the reticle 2. At the time of exposure, the slit plate is switched such that the arc illumination region is irradiated with light, and at the time of positioning of the reticle 2 (alignment), the slit plate is switched such that the region including the alignment mark is irradiated with light.

When it is not desired to transfer, onto the wafer 10, a redundant circuit pattern (or portion other than a pattern region) formed in the same reticle, the movable blind prevents the redundant circuit portion from being included in the illumination region. Movement of the movable blind in the Y direction is controlled in synchronization with movement of the reticle stage 3 in the Y direction by a predetermined driving mechanism. In this case, the movable blind may start scanning in the same manner as the reticle 2 after the reticle 2 started scanning, or may start moving when a target pattern to be hidden comes to the illumination region.

Next, the projection optical system 200 of the present example will be explained in detail. The projection optical system 200 is a reflection system including a reflection optical device (mirror) only, and its projection magnification from the reticle 2 to the wafer 10 is ¼ times. Therefore, the EUV light EL reflected by the reticle 2 and including pattern information formed on the reticle 2 forms, onto the wafer 10, an image which is reduced to ¼ of the pattern in the illumination region of the reticle 2 through the projection optical system 200.

The projection optical system 200 includes four mirrors (reflection optical devices) in total, i.e., a first mirror 6, a second mirror 7, a third mirror 8 and a fourth mirror 9. The projection optical system 200 further includes a lens barrel 14 for holding these mirrors 6 to 9. The first mirror 6 and the fourth mirror 9 have concave aspherical reflection surfaces, the second mirror 7 has a flat reflection surface, and the third mirror 8 has a convex spherical reflection surface. It is preferable that a convex surface such as the reflection surface of the third mirror 8 is a spherical surface to suit the convenience of working and measuring operations. A material of each of the mirrors is a low-expansion glass or metal, and each mirror is formed on its surface with a reflection layer for reflecting EUV light EL. The reflection layer is formed of a multilayered film including two kinds of materials laminated alternately like the reticle 2.

In this case, the fourth mirror 9 is formed with a through hole so that light (exposure beam) reflected by the first mirror 6 can reach the second mirror 7. Similarly, in order for light reflected by the fourth mirror 9 to reach the wafer 10, an outward appearance of the first mirror 6 is formed with a notch so that a luminous flux can pass therethrough. The first mirror 6 may be formed with a through hole.

When exposure is performed using the EUV light EL, since space in which the projection optical system 200 is placed is also maintained under vacuum, heat caused by irradiation of the exposure beam can not be released by only disposing the mirrors 6 to 9. Thereupon, in the present example, the mirrors 6 to 9 and the mirror barrel 14 holding the mirrors 6 to 9 are connected to each other through heat pipes HP, and a cooling apparatus (not shown) for cooling the mirror barrel 14 is provided. That is, the mirror barrel 14 is formed into a double structure including an inner mirror holding portion and a cooling jacket mounted to its outer periphery. A helical pipe for flowing a cooling liquid is provided in the cooling jacket. Here, a cooling water is used as the cooling liquid. The cooling water flowing out from the cooling jacket through an outflow tube performs the heat exchange with a refrigerant in the cooling apparatus (not shown) and cooled down to a predetermined temperature and then, flows into the pipe in the cooling jacket, and the cooling water circulates in this manner.

For this reason, in the projection optical system 200 of the present example, even if thermal energy is given to the mirrors 6 to 9 by the irradiation of the EUV light EL, the thermal exchange is performed by the heat pipes HP between the mirrors and the mirror barrel 14 whose temperature is adjusted to a constant value, and a temperature of each of the mirrors 6 to 9 is maintained at a constant value. In this case, in the present example, the heap pipes HP are attached not only to the back surface sides of the mirrors 6, 7, 9 and the like but also to portions of the front surface sides (at the reflection surface sides) thereof which are not irradiated with exposure beam. Therefore, the mirrors can be cooled more effectively as compared with a case in which only the back surface side is cooled. The heat pipes HP on the back surface side of the third mirror 8 and the front surface side of the first mirror 6 reach the inner peripheral surface of the mirror barrel 14 in a direction of depth on the paper sheet of FIG. 1. The mirror barrel 14 has a square prism like outer appearance.

The wafer 10 is placed on a wafer stage 11. The wafer stage 11 is supported in a floating manner by a magnetic levitation type two-dimensional linear actuator 16 on a wafer base 15 disposed along an XY plane. The actuator 16 includes a permanent magnet provided on a bottom surface of the wafer stage 11, and a coil running throughout on the wafer base 15 two dimensionally of the X and Y directions. The wafer stage 11 is driven in the X and Y directions by the actuator 16 through a predetermined stroke (e.g., about 300 to 400 mm), and is driven also in the θ direction (direction of rotation around the Z axis) slightly. It is also possible to slightly drive the wafer stage 11 in an inclined direction with respect to the Z direction and the XY plane by the actuator 16.

An electrostatic chuck type wafer holder (not shown) is placed on the upper surface of the wafer stage 11, and the wafer 10 is adsorbed and held by the wafer holder. Although it is not illustrated in FIG. 1, a side surface of the wafer stage 11 in the +Y direction is mirror-finished and formed with a reflection surface for reflecting visible light. Similarly, a side surface of the wafer stage 11 in the −X direction is also formed with a reflection surface for reflecting visible light. A position and a rotation amount (yawing amount, pitching amount and rolling amount) of the wafer stage 11 in the XY plane with respect to the projection optical system 200, for example, are precisely measured by an interferometer system which irradiate the reflection surfaces with measurement beams.

A position and an inclination amount of the wafer 10 in the Z direction with respect to the mirror barrel 14 shown in FIG. 1 are measured by the AF sensors 12 and 13 including an illumination optical system 12 for diagonally projecting a slit image onto a surface to be detected and a photoreceiver optical system 13 for re-forming the image of the slit image from a luminous flux from the surface to be detected and outputting a signal which corresponds to a lateral deviation amount of the re-formed image. As the FA sensors, for example, a multipoint focus position detecting system disclosed in Japanese Patent Application Laid-open No. 6-283403 and the corresponding U.S. Pat. No. 5,448,332, the disclosures of which are herein incorporated by reference, can be used. It is important that the AF sensors 12 and 13 are integrally secured to the mirror barrel 14. The wafer stage 11, i.e., the focus position and the inclination angle of the wafer 10 are corrected through the magnetic levitation type two-dimensional linear actuator 16 based on the measured values from the AF sensors 12 and 13.

One end of the upper surface of the wafer stage 11 is provided with a space image measuring member FM for EUV light. The space image measuring member FM measures a relative positional relation (i.e., a so-called base line amount) between a position where the pattern formed on the reticle 2 is projected onto the surface of the wafer 10 and a detection center of an alignment sensor ALG. The space image measuring member FM corresponds to a reference mark plate of the conventional exposure apparatus using DUV light.

An upper surface of the space image measuring member FM is formed with a slit as an opening. This slit is formed by making a pattern in the EUV light reflection layer formed on a surface of a fluorescence generating material secured on the upper surface of the wafer stage 11 and having a predetermined thickness. A photoelectric conversion device such as a photo multiplier is disposed in the wafer stage 11 at the bottom surface side of the slit. With this disposition, when the space image measuring member FM is irradiated with EUV light EL from above through the projection optical system 200, the EUV light EL which has passed through the slit reaches the fluorescence generating material, and this fluorescence generating material emits light having a longer wavelength than that of the EUV light. This light is received by the photoelectric conversion device and converted into a detection signal corresponding to intensity of the light. With this operation, the projection position on the wafer stage 11 of the reticle pattern can be easily obtained. Instead of this reflection layer, an EUV light absorbing layer may be provided, and this absorbing layer may be formed with the slit.

Next, the operation of the exposure procedure after the second layer by the exposure apparatus of the present example will be explained. The laser plasma light source of the illumination system 100 does not emit light until the alignment operation of the reticle or the exposure of the wafer is started. In FIG. 1, the reticle 2 is transferred by a reticle transfer system (not shown) and the reticle 2 is adsorbed and held by the reticle holder of the reticle stage 3 located on the loading position. The wafer 10 on which an EUV light EL-sensitive resist is applied is placed on the wafer stage 11 by a wafer transfer system (not shown) and wafer-delivery mechanism (not shown) on the wafer stage 11.

Next, a position of the wafer alignment mark (one or more per one shot) which is a previously determined as a sample of the wafer alignment marks provided in each shot region of the wafer 10 on the wafer stage 11 is detected using the alignment sensor ALG while sequentially moving the wafer stage 11. When the detection of the positions of the wafer alignment marks of the sample shots was completed, coordinates of arrangement in all the shot regions on the wafer 10 are obtained using statistical technique utilizing least squares method disclosed in, e.g., Japanese Patent Application Laid-open No. 61-44429 and the corresponding U.S. Pat. No. 4,780,617, the disclosures of which are herein incorporated by reference, using the detected data (this alignment technique is called as "EGA (enhanced global alignment" hereinafter). Alternatively, a variation amount including coordinates of arrangement in all the shot regions on the wafer 10 and magnification of each shot are obtained using statistical technique utilizing least squares method disclosed in, e.g., Japanese Patent Application Laid-open No. 6-275496, the disclosure of which is herein incorporated by reference, using the data of detected positions of the plurality of wafer alignment marks in the shots (this alignment technique is called as "multipoint EGA in shots" hereinafter).

When the measurement of the alignment was completed in this manner, a variation in magnification of the shot (X, Y scaling) is calculated based on a shot distance found from the result of the above-described EGA, or based on a shot size found from the result of the above-described multipoint EGA in shots. Then, calculation is carried out for obtaining a control amount of projection magnification for making a size of the reticle pattern image in the X direction (second direction) coincident with a size of the shot region on the wafer 10 in accordance with the magnification variation amount, i.e., a driving amount of the reticle 2 in the Z direction, and the reticle 2 is driven in the Z direction (vertical direction) by the calculated amount.

When the reticle 2 is driven in the Z direction, the projection magnification is varied and the position of the projection region of the reticle pattern image is deviated. Therefore, the base line and the projection magnification are measured using the space image measuring member FM as described above. Next, based on the result of the measurement of magnification, it is judged whether an adjustment remaining error of the projection magnification with respect to the target magnification adjustment amount is equal to or smaller than the allowance. If the result of the judgment was NO, i.e., if the adjustment remaining error of the projection magnification exceeded than the allowance, a procedure is return to the step for driving the reticle 2 for re-setting the projection magnification, and the reticle 2 is re-driven in the Z direction and then, the above-described procedure and judgment are repeated. On the other hand, if the result of the judgment was YES, i.e., if the adjustment remaining error of the projection magnification was equal to or smaller than the allowance, the slip plate below the reticle 2 is switched to a position where the illumination region is irradiated with the EUV light EL and then, the procedure is advanced to a next step.

Next, scanning and exposure are carried out in the step-and-scan manner using the EUV light EL as the exposure beam. That is, in accordance with the position information, obtained by the above described procedure, on each regions on the wafer 10, the wafer stage 11 is positioned at a scan-starting position of a first shot and the reticle stage 3 is positioned at a scan-starting position while monitoring position information from the AF sensors 4, 5, the AF sensors 12, 13 and the interferometer system, thereby carrying out the scanning and exposure of the first shot. When the scanning and exposure are carried out, speeds of the following both stages are controlled such that the velocity ratio of the reticle stage 3 and the wafer stage 11 substantially coincide with the projection magnification of the projection optical system 200, and the exposure (transfer of reticle pattern) is carried out in a constant speed and synchronization state of the velocity ratio of the both stages. When the scanning and exposure of the first shot were completed, a stepping action is carried out between shots in which the wafer stage 11 is moved the scan-starting position of a second shot. The scanning and exposure of the second shot are carried out in the same manner as that described above.

In this case, in order to omit an action for returning the reticle stage 3 to enhance the throughput, the scanning and exposure directions of the first and second shots are made opposite from each other, i.e., if the first shot was exposed to light from −side to +side on the Y axis, the second shot is exposed to light from +side to −side. That is, scanning is carried out alternately. In this manner, the stepping action between the shots and the scanning and exposure action of the shots are repeated, and the pattern of the reticle 2 is transferred in all the shot regions on the wafer 10 in the step-and-scan manner. A series of procedure with respect to one wafer 10 is completed in this manner.

According to the present example, since the EUV light EL having a wavelength of 5 to 20 nm is used as the exposure beam, even if a numerical aperture of the reflection system including only the plurality of mirrors (reflection optical devices) 6 to 9 as the projection optical system 200 is not so high, it is possible to precisely transfer an extremely fine pattern such as a line-and-space pattern having a pitch of 100 to 70 nm, or an isolating line pattern of line width of 70 to 55 nm.

At the time of such an exposure operation, according to the exposure apparatus of the present example, it is possible, by using the transmission filter 18, to suppress the reduction in a reflectance of the reflection member caused by debris generated from the laser plasma light source in the illumination system 100. Further, almost no debris reach the reflection members disposed closer to the reticle 2 than the transmission filter 18, it is possible to reduce a frequency of replacement of these reflection members. Therefore, there is a merit that a workload of maintenance operation of the exposure apparatus is lightened.

The nozzle NZL may be made of material having high transmittance with respect to the EUV light EL (more specifically, material having higher transmittance than noble metal), or material selected from those used in the multilayered film formed on the reflection surface such as the condenser mirror CM and the reflecting mirror 17. In this case, even if debris generated by erosion of the nozzle NZL is attached to the condenser mirror CM or the reflecting mirror 17, since the debris have high transmittance with respect to the EUV light EL, the reflectance of the condenser mirror CM and the reflecting mirror 17 is not extremely lowered. Therefore, the number of maintenance operations (replacement and cleaning of mirrors) can be reduced, and the productivity of semiconductor devices can be enhanced. It is possible to prolong the life of the transmission filter 18.

Although it is not illustrated in FIGS. 2 and 3, the nozzle NZL, the condenser mirror CM and the like are accommodated in an evacuated container. A transparent window which is provided on the evacuated container and which allows EUV light to pass therethrough may be formed with a thin film capable of selecting a wavelength, and only the EUV light EL may be allowed to pass through the transparent window. At that time, at least one element of the illumination system (the reflecting mirror 17, the fly eye mirrors FEM1, FEM2 and the condenser mirror CDM in the present example) is disposed in the evacuated container.

Although the EUV light having a wavelength of 5 to 20 nm, especially about 11 nm or about 13 nm is used as the exposure beam in the above-described embodiment, the wavelength of the exposure beam is not limited to these values. For example, EUV light EL having a wavelength of about 100 nm or smaller is effective as the exposure beam. Known typical wavelength of the EUV light EL is 1.5 nm, 13.4 nm and the like. Recently, EUV light having a wavelength of about 50 nm becomes a promising candidate in order to lower the required surface precision of mirror.

The exposure apparatus in the above embodiment is assembled by adjusting the illumination system 100 and the projection optical system 200, and connecting the constituent elements electrically, mechanically or optically. The wafer 10 exposed with light in the above-described manner is subjected to a developing step, a pattern-forming step, a bonding step and the like, thereby producing a device such as a semiconductor device.

In the above-described embodiment, the present invention is applied to the scanning and exposure type and reduction projection type exposure apparatus. The present invention can also be applied to an illumination system of a proximity-type exposure apparatus which transfers a pattern of the reticle directly onto a wafer using EUV light without through a projection optical system, or to a full field exposure type projection exposure apparatus.

According to the exposure method of the present invention, when a laser plasma light source is used as a light source for exposure, for example, even if scattering particles are generated from the light source, it is possible to suppress the deterioration in optical characteristics such as reduction in reflectance of a plurality of reflection members.

According to the exposure apparatus of the invention, it is possible to carry out the exposure method of the invention. Further, since almost no scattering particles reach the reflection members disposed closer to the pattern than the transmission member, it is possible to reduce a frequency of replacement of these reflection members. Therefore, there is a merit that a workload of maintenance operation of the exposure apparatus is lightened.

When the reflection type optical integrator is disposed between the light source and the pattern, and the transmission member is disposed between the light source and the optical integrator, even if the transmittance of the transmission member becomes uneven and the illumination of the exposure beam becomes uneven in some degree due to variation in thickness of the transmission member, due to the attachment of the scattering particles to the transmission members or the like, the illumination distribution of the exposure beam is uniformalized by the reflection type optical integrator.

The entire disclosure of Japanese Patent Application No. 11-157635 filed on Jun. 4, 1999 including specification, claims, drawings and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. An exposure method, which transfers, using light having a wavelength of 100 nm or smaller as an exposure beam, a predetermined pattern onto a substrate, comprising:

reducing, when said pattern is irradiated with the exposure beam through a plurality of reflection members, particles mixed in the exposure beam between, of the plurality of the reflection members, a first reflection member which condenses the exposure beam and a second reflection member which makes an illuminance distribution of the exposure beam substantially uniform at the pattern.

2. An exposure method as recited in claim 1, wherein:

an optical element through which said exposure beam is transmitted is disposed between said first and second reflection members to reduce said particles.

3. An exposure method as recited in claim 2, wherein:

said optical element is disposed at a condensing point of said extreme ultra violet light by said first reflection member or at a vicinity thereof.

4. An exposure method as recited in claim 2, wherein:

another optical element is disposed on said optical path in exchange for said optical element.

5. An exposure method as recited in claim 2, wherein:

said exposure beam is extreme ultra violet light generated from said laser plasma light source; and said first reflection member includes a first focus from which said extreme ultra violet light is generated and a second focus on which said extreme ultra violet light is condensed.

6. An exposure apparatus which transfers, using light having a wavelength of 100 nm or smaller as an exposure beam, a predetermined pattern onto a substrate, comprising:

a light source which generates the light having the wavelength of 100 nm or smaller as the exposure beam;

a plurality of reflection members which guides the exposure beam emitted from the light source to the pattern, the plurality of the reflection members including a first reflection member which condenses the exposure beam and a second reflection member which makes an illuminance distribution of the exposure beam substantially uniform at the pattern; and a transmission member disposed, to reduce particles generated at the light source on an optical path of the exposure beam between the first reflection member and second reflection member and having a predetermined transmittance.

7. An exposure apparatus as recited in claim 6, wherein at least one of said reflection members is disposed between said transmission member and said substrate.

8. An exposure apparatus as recited in claim 6, wherein:

said second reflection member is a reflection type optical integrator.

9. An exposure apparatus as recited in claim 8, wherein said transmission member is disposed immediately in front of said optical integrator.

10. An exposure apparatus as recited in claim 6, wherein said transmission member has a transmittance of 10% to 90% with respect to said exposure beam.

11. An exposure apparatus as recited in claim 6, wherein said light source is a laser plasma light source, and said exposure beam is of extreme ultra violet light having a wavelength of 5 nm to 50 nm.

12. An exposure apparatus as recited in claim 6, wherein:

said transmission member is disposed at a condensing point of said extreme ultra violet light by said first reflection member or at a vicinity thereof.

13. An exposure apparatus as recited in claim 6, further comprising:

a replacing member which dispose another transmission member on said optical path in exchange for said transmission member.

14. An exposure apparatus as recited in claim 6, wherein:

said light source is a laser plasma light source which generates extreme ultra violet light as said exposure beam; and said first reflection member includes a first focus from which said extreme ultra violet light is generated and a second focus on which said extreme ultra violet light is condensed.

15. An exposure apparatus which transfers a pattern formed on a mask onto an object, comprising:

a light source which generates extreme ultra violet light;

an illumination optical system disposed, to illuminate said mask with said extreme ultra violet light, on an optical path through which said extreme ultra violet light passes, said illumination optical system including a plurality of reflection optical elements which includes an optical integrator; and an optical element disposed on said optical path at a condensing point of said extreme ultra violet light or at a vicinity thereof to reduce substances which are generated at said light source, flow into said optical path and lower reflectivity of said reflection optical elements.

16. An exposure apparatus as recited in claim 15, wherein:

a reflection condensing element which condenses said extreme ultra violet light is disposed closer to the optical source than said optical integrator.

17. An exposure apparatus as recited in claim 16, further comprising:

a replacing member which disposes another optical element on said optical path in exchange for said optical element.

18. An exposure apparatus as recited in claim 16, wherein:

said light source is a laser plasma light source; and said reflection condensing element includes a first focus from which said extreme ultra violet light is generated and a second focus on which said extreme ultra violet light is condensed.

19. An exposure apparatus as recited in claim 18, wherein:

said light source includes the same material that is used in said reflection condensing element or in a reflection surface of said reflection optical element, and comprises a nozzle which injects a target.

20. An exposure apparatus as recited in claim 16, wherein:

said optical element has a transmittance of 10% to 90% with respect to said exposure beam.

\* \* \* \* \*